United States Patent [19]

Park

[11] Patent Number: 5,604,498
[45] Date of Patent: Feb. 18, 1997

[54] HUFFMAN DECODER

[75] Inventor: Heon-chul Park, Ansan, Rep. of Korea

[73] Assignee: Samsung Electronics Co., Ltd., Suwon, Rep. of Korea

[21] Appl. No.: 496,881

[22] Filed: Jun. 30, 1995

[51] Int. Cl.⁶ .................................................. H03M 7/40
[52] U.S. Cl. .................................................. 341/65; 341/67
[58] Field of Search ........................ 341/65, 67, 106

[56] References Cited

U.S. PATENT DOCUMENTS 5,404,166  4/1995  Gillard et al. ........................ 348/390

Primary Examiner—Brian K. Young
Attorney, Agent, or Firm—Allen LeRoy Limberg

[57] ABSTRACT

A Huffman decoder includes a first latch for storing the current variable-length-encoded data, a second latch for storing the previous variable-length-encoded data, a single decoder for receiving the word size and outputting a selection signal, a data requirement signal generator for generating a data requirement signal when the added word size is over a predetermined size after summing the word sizes, a multiplexer for receiving the outputs of the first and second latches to select a predetermined bit according to the selection signal, a data rotator for cyclic-shifting the output of the multiplexer according to the word size to form a reconstructed data and outputting the reconstructed data, an addressing portion for comparing the reconstructed data with a predetermined value and decoding the data, and a memory for storing the size of the variable-length-encoded word and the fixed-length code corresponding thereto which are output according to the output of the addressing portion.

3 Claims, 4 Drawing Sheets

HUFFMAN DECODER

BACKGROUND OF THE INVENTION

The present invention relates to a Huffman decoder as a kind of variable-length decoder for compressing an image signal, and more particularly, to a Huffman decoder of a look-up table type where the size of a search memory is smaller than ever.

By the compression algorithms such as MPEG, JPEG, pX64(H.261) and the like, as international standards for multimedia, a DCT-converted image signal is variable-length-encoded for transmission. Thus, Huffman decoding is used at the receiving end to decode variable-length code into the original fixed-length code. The conventional Huffman decoder for multimedia representatively uses such methods as tree searching and a look-up table. Here, Huffman decoding, as a kind of variable-length decoding, receives variable-length encoded code for restoration to fixed-length code.

For example, the variable-length code input for one fixed-length output word is generally composed of 2–24 bits. Theoretically, the length of an input string for a fixed-length output word of n bits can be expressed as 2 to $2^n-1$ bits.

In the conventional Huffman decoding, when the tree search method is used, the size of the search memory required for code conversion can be minimized. However, the search time is relatively long due to the characteristics of tree searching. As a result, it is difficult for the tree search method to be applied to an apparatus requiring fast processing, e.g., to digital television, HDTV or the like.

Meanwhile, when the look-up table method is used, the search time can be reduced. However, there is a problem that a die area is increased in manufacturing VLSI due to the increase of memory size for a table search.

SUMMARY OF THE INVENTION

To solve the above problems, it is an object of the present invention to provide a Huffman decoder which adopts the look-up table method while reducing the size of a search memory.

To achieve the above object according to the present invention, there is provided a Huffman decoder for receiving a variable-length-encoded data and outputting a fixed-length code corresponding to the data reconstructed in a Huffman table selected according to a table selection signal, the Huffman decoder comprising: a first latch for storing the current variable-length-encoded data; a second latch for storing the previous variable-length-encoded data; a single decoder for receiving the word size and outputting a selection signal; a data requirement signal generator for generating a data requirement signal when the added word size is over a predetermined size after summing the word sizes; a multiplexer for receiving the outputs of the first and second latches, to select a predetermined bit according to the selection signal; a data rotator for cyclic-shifting the output of the multiplexer according to the word size to form a reconstructed data and outputting the reconstructed data; an addressing portion for comparing the reconstructed data with a predetermined value and decoding the data; and a memory for storing the size of the variable-length-encoded word and the fixed length code corresponding thereto which are output according to the output of the addressing portion.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

To facilitate the understanding a Huffman decoder, general matters in Huffman decoding will be described.

In the compression of image signal, finally, a quantized discrete cosine transform (DCT) coefficient is further compressed (data-compressed) through entropy encoding, whereby a variable-length code is used according to a statistical characteristic. This is a lossless coding process and is different from the quantization process. Entropy codes include the Huffman, arithmetic and universal codes. The quantized DCT coefficient is variable-length-encoded (VLC) using the Huffman coding. Here, the variable-length-encoding portion classifies a DCT coefficient into DC and AC coefficients and encodes these two kinds of coefficients using different methods. Since, generally, the DC value of each block has a high correlation with the DC value of peripheral block, a difference value with respect to the previous-block DC value is obtained and the difference value is encoded. After the difference between the DC value of first block and a medium value 128 of variable range of DC values is obtained, the difference value is encoded through one-dimensional variable-length code. Also, the coefficients are rearranged as one dimension through a zigzag scan for effectively performing data compression using the high probability that the AC coefficient value is not "0" near the DC coefficient and is "0" far from the DC coefficient, in DCT region. Here, the number of consecutive "0" and the value of coefficient not "0" are expressed in two dimensions, that is, run and level, respectively. For example, the DCT coefficient arrangement, such as 30, 2, 0, 0, −8, 0, 0, 0, 9, . . . , which is achieved through zigzag scanning, is expressed as (0,30), (0,2), (2,−8) and (3,9) through the run-level encoding.

Figure 1:
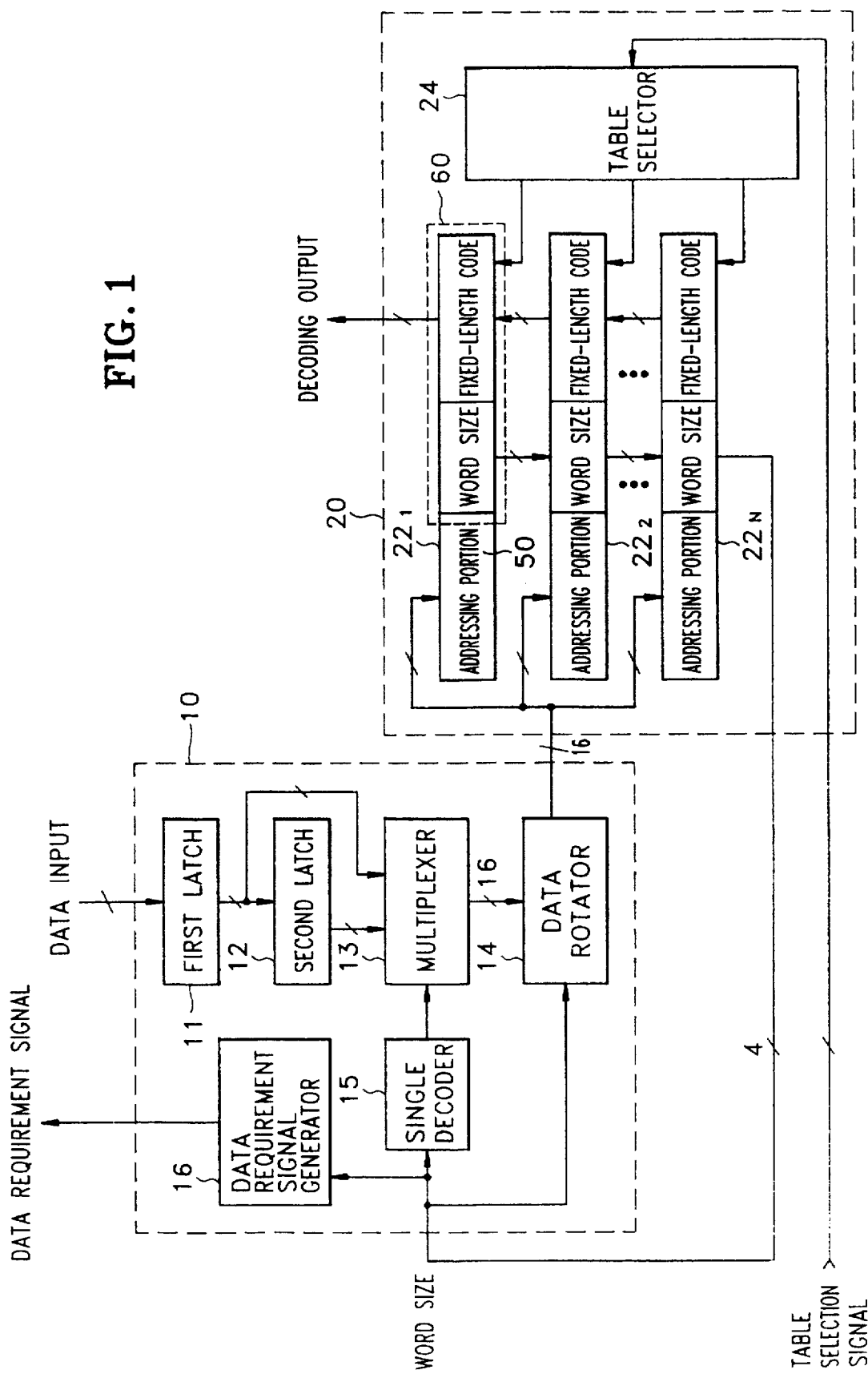
FIG. 1 is a block diagram showing a Huffman decoder of a preferred embodiment according to the present invention.

The Huffman decoder of a preferred embodiment according to the present invention shown in FIG. 1 comprises a data input portion 10 for receiving and rotating the variable-length-encoded data and a Huffman table portion 20 having N Huffman tables classified according to a statistical characteristic of the data.

In FIG. 1, data input portion 10 comprises first and second latches 11 and 12, a multiplexer 13, a data rotator 14, a single decoder 15 and a data requirement signal generator 16, requires the data from data transmitting part according to the added value of word sizes (when the added value is over sixteen according to a preferred embodiment of the present invention) for receiving the variable-length-encoded data, rotates the data according to the word size and outputs the rotated data. Huffman table portion 20 comprises a table selector 24 for selecting a specific table according to a table selection signal and N Huffman tables $22_1$–$22_N$ for outputting the decoded fixed-length code and word size corresponding to the output of data input portion 10. Each of Huffman tables $22_1$–$22_N$ is composed of an addressing portion 50 and a memory portion 60 for storing the word size and fixed length code and outputs the word size and fixed code decoded according to the input data. Here, "word size" means the length of data currently decoded and the decoded value is a fixed length code as an output value of the Huffman decoder.

That is, a predetermined fixed-length code to be output and the length of the variable-length encoded data string, that is, word size, are stored in one Huffman table, and one of comparators of addressing portion 50 is selected by upper bits of an input code word. The lower bits of the input code word are input into a binary decoder corresponding to the selected comparator, to select one place of the table, and the content of the place is output as a result of decoding the variable-length-code. Also, using the length information (word size) of input data stored in a ROM table, data input portion 10 deletes as much of the current data as word size and, at the same time, supplements the data input to first latch 11 by an equivalent amount.

Here, table selector 24 for selecting a table when a plurality of Huffman tables are used, is externally provided via a host processor. Also, in a preferred embodiment of the present invention, the host processor has a 16-bit data bus.

In FIG. 1, first latch 11 latches and stores the current 16-bit input data and second latch 12 stores the 16-bit input data which was previously stored in first latch 11. Single decoder 15 receives the word size for multiplexer 13 to select required 16-bit data from the first and second latches 11 and 12. That is, multiplexer 13 receives the outputs of first and second latches 11 and 12 as upper and lower bit groups, respectively, and selects corresponding 16 bit data according to the output of single decoder 15 and outputs the selected data into 16-bit data rotator 14. Then, the 16-bit data rotator 14 shifts the output of multiplexer 13 according to the word size to thereby reconstruct the data so that a specific region of memory can be addressed.

The operation of 16-bit data rotator 14 will be described with reference to FIG. 4.

Data requirement signal generator 16 generates the data requirement signal, whereby first latch 11 is required to receive the data whenever the length of data to be deleted is over sixteen bits. Single decoder 15 converts the binary input into single data. When the outputs of single decoder 15 are "1" and "0," the 16-bit data of first latch 11 and the data of second latch 12 are output, respectively, and the outputs are entered into control input (SEL) of a multiplexer. That is, when the input of single decoder 15 is "0011," the output is "1110 0000 0000 000." Also, data rotator 14 performs a cyclic shift-left operation.

Figure 2:
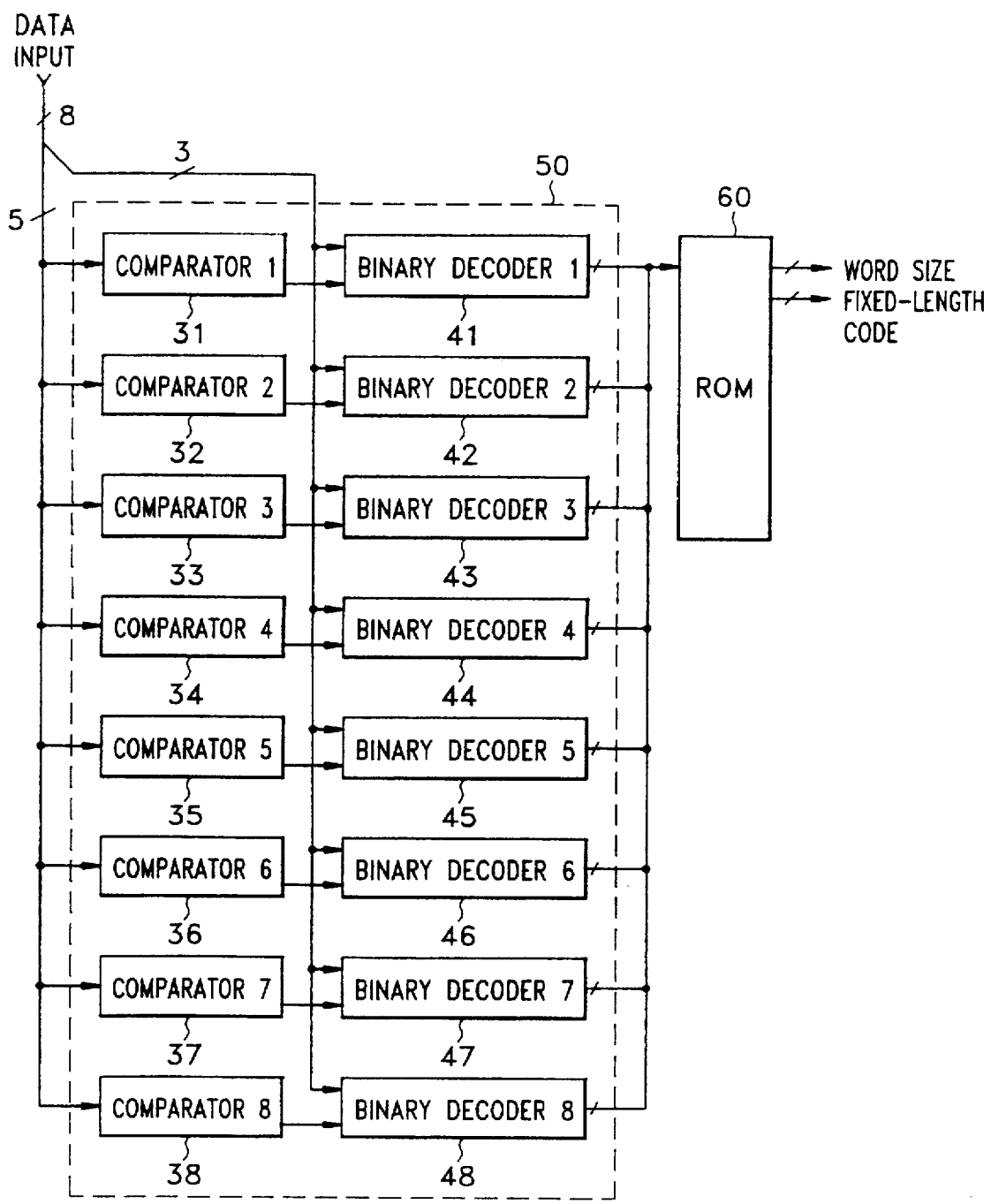
FIG. 2 is an example of the Huffman table shown in FIG. 1.

FIG. 2 is an example of the Huffman table shown in FIG. 1. Table 1 is an example of variable-length code, that is, a Huffman table, for increasing a macroblock address on the macroblock addressing of MPEG(I) published by ISO/IEC, JTC, 1/SC and 29/WG.

In Table 1, it is known that one to five bits are allocated to increasing values of below seven which are frequently used and eleven bits are allocated to increasing values of above twenty-six which are not frequently used. In order to reduce the memory size according to the present invention, the variable-length data is expressed as eight blocks on the basis of a position where a "1" appears in the variable-length data for the first time. This table is merely one example of the N Huffman tables existing in Huffman table portion 20 and is selected by the table selection signal. According to the present invention, an example where Table 1 is realized by hardware is shown in FIG. 2.

In FIG. 2, addressing portion 50 is composed of first to eighth comparators 31 to 38 and first to eighth binary decoders 41 to 48. Memory 60 stores the data of the Huffman table and outputs the corresponding fixed-length code and word size according to the output of addressing portion 50.

The first block of Table 1 can be accessed by first comparator 31 and first binary decoder 41, the fifth block of Table 1 can be accessed by fifth comparator 35 and fifth binary decoder 45, and the eighth block of Table 1 can be accessed by eighth comparator 38 and eighth binary decoder 48. The remaining blocks can be accessed by the same method as above. In FIG. 2, the five upper bits of the input data are input into each of first to eighth comparators 31 to 38 and one comparator among those is selected. First to eighth binary decoders 41 to 48 receive the output of the comparator selected by the upper bits, and the three lower bits of the input data and output the word size and the decoded fixed code value stored in corresponding address of memory 60. Huffman decoder of the present invention can simply access a ROM table corresponding to the input variable-length-encoded data without an extra ROM and can be composed of comparator and binary decoder, so that unnecessary excess memory size can be eliminated. Also, the search time can be reduced.

Figure 3:
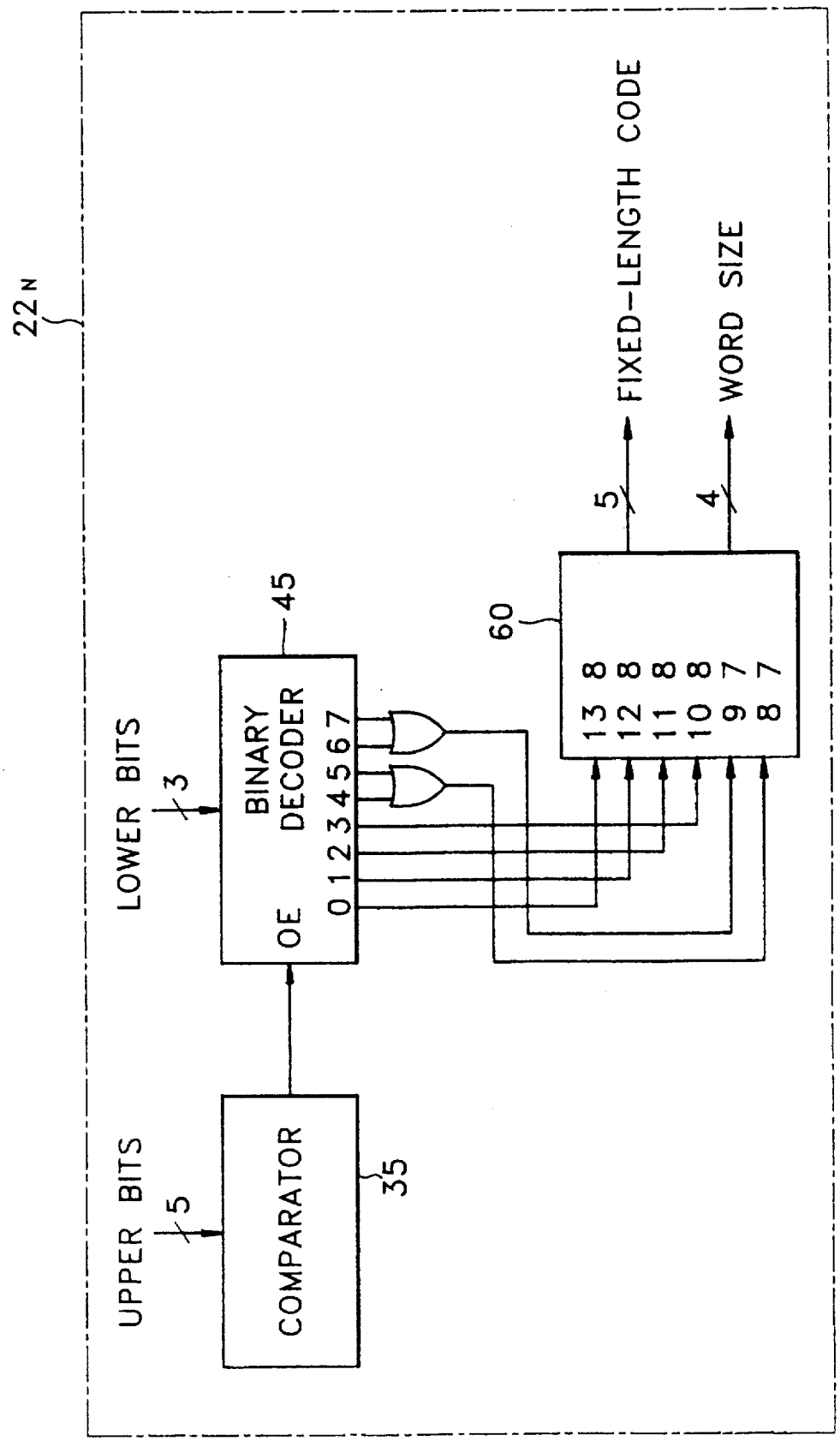
FIG. 3 is a detailed example of the fifth comparator and the fifth binary decoder shown in FIG. 2.

FIG. 3 is a detailed example of the fifth block shown in Table 1.

In FIG. 3, fifth comparator 35 activates fifth binary decoder 45 when the input upper five bits of variable-length code (input data) is "00001" set in the comparator, which is the upper five bits of variable length code of fifth block in Table 1. That is, the comparators 31 to 35 of FIG. 2 set a reference address (e.g., the fourth block is "0001" and the sixth block is "0000 01") of itself for classifying the block and activates the corresponding binary decoder when the five upper bits of the input data matches the set value. Fifth binary decoder 45 receives the lower three bits of the input data and outputs the decoded value (fixed-length code) and word size stored in the corresponding ROM 60. That is, since the corresponding data value is "13," as shown in Table 1, when the input data is "000," the "13" stored in ROM 60 is output as a fixed-length binary representation of five bits and "8" as the word size value (that is, bit number) is output as four bits. Since the corresponding data value is "8" and the word size is "7," when the input data is "111," as shown in Table 1, these values are output in the binary form.

Figure 4:
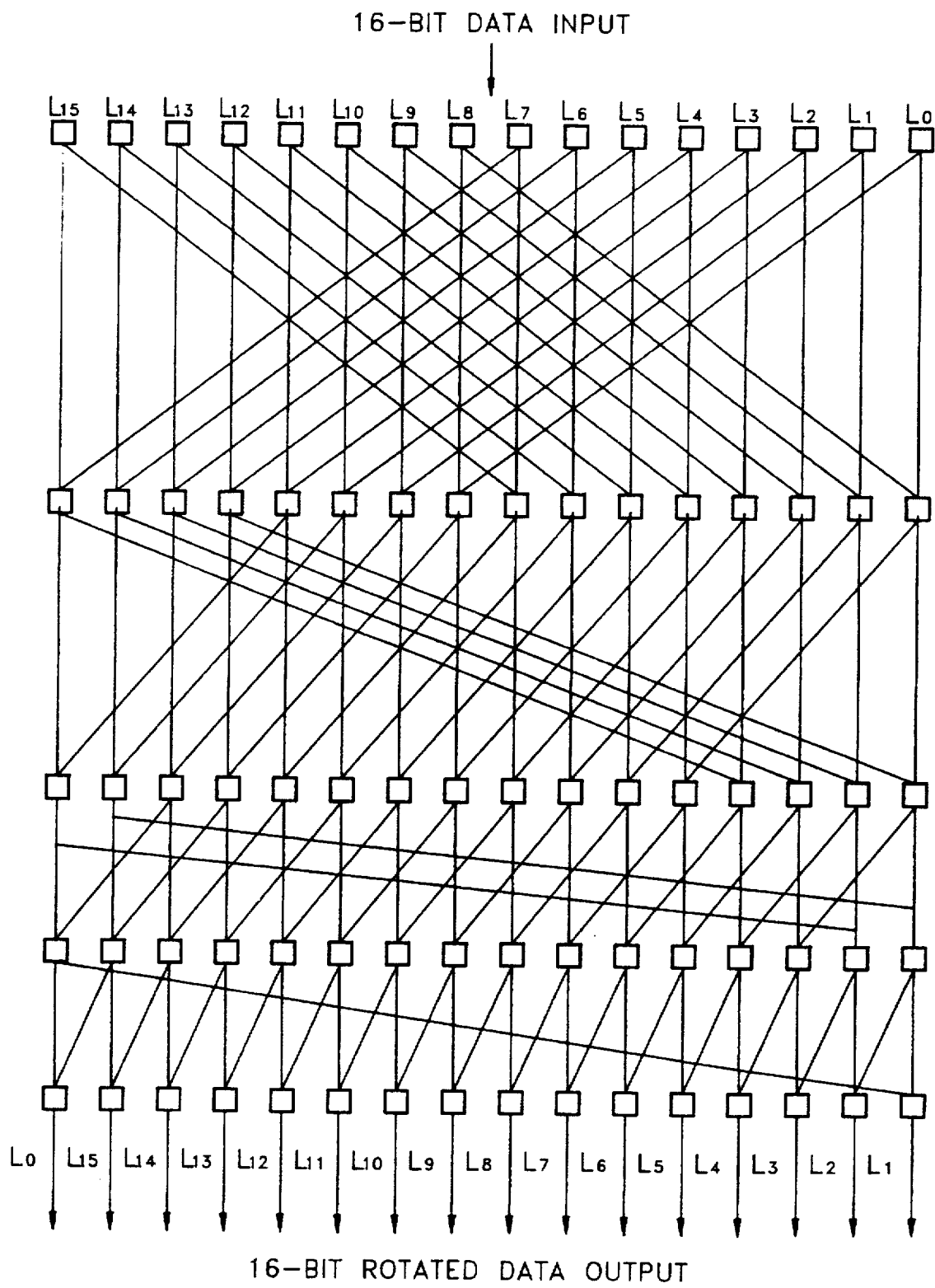
FIG. 4 is an operating example of a data rotator shown in FIG. 1.

FIG. 4 is an operating example of the data rotator.

In FIG. 4, the outputs of multiplexer 13 (from the right side, $L_0$–$L_{15}$) are rearranged via the rotary left-shift (from the right side, $L_1$–$L_{15}$ and $L_0$) to be output.

As described above, the Huffman decoder according to the present invention, which is used in a variable-length decoder, reduces the size of a search memory, so that die size can be reduced in VLSI manufacturing. Also, decoding at high speed is possible owing to the improved search speed.

TABLE 1

| variable length code (VLC | increasing value (content of code) |
|---|---|
| 1 | 1 |
| 011 | 2 |
| 010 | 3 |
| 0011 | 4 |
| 0010 | 5 |

TABLE 1-continued

| variable length code (VLC | | | increasing value (content of code) |
|---|---|---|---|
| 0001 | 1 | | 6 |
| 0001 | 0 | | 7 |
| 0000 | 111 | | 8 |
| 0000 | 110 | | 9 |
| 0000 | 1011 | | 10 |
| 0000 | 1010 | | 11 |
| 0000 | 1001 | | 12 |
| 0000 | 1000 | | 13 |
| 0000 | 0111 | | 14 |
| 0000 | 0110 | | 15 |
| 0000 | 0101 | 11 | 16 |
| 0000 | 0101 | 10 | 17 |
| 0000 | 0101 | 01 | 18 |
| 0000 | 0101 | 00 | 19 |
| 0000 | 0100 | 11 | 20 |
| 0000 | 0100 | 10 | 21 |
| 0000 | 0100 | 011 | 22 |
| 0000 | 0100 | 010 | 23 |
| 0000 | 0100 | 001 | 24 |
| 0000 | 0100 | 000 | 25 |
| 0000 | 0011 | 111 | 26 |
| 0000 | 0011 | 110 | 27 |
| 0000 | 0011 | 101 | 28 |
| 0000 | 0011 | 100 | 29 |
| 0000 | 0011 | 011 | 30 |
| 0000 | 0011 | 010 | 31 |
| 0000 | 0011 | 001 | 32 |
| 0000 | 0011 | 000 | 33 |
| 0000 | 0001 | 111 | 34 (macroblock stuffing) |
| 0000 | 0001 | 000 | 35 (macroblock escape) |

What is claimed is:

1. A Huffman decoder for receiving variable-length-encoded data and outputting a fixed-length code corresponding to the data reconstructed in a Huffman table selected according to a table selection signal, which comprises:

a first latch for storing the current variable-length-encoded data;

a second latch for storing the previous variable-length-encoded data;

a single decoder for receiving the word size and outputting a selection signal;

a data requirement signal generator for generating a data requirement signal when the added word size is over a predetermined size after summing the word sizes;

a multiplexer for receiving the outputs of said first and second latches, to select a predetermined bit according to said selection signal;

a data rotator for cyclic-shifting the output of said multiplexer according to said word size to form a reconstructed data, and outputting said reconstructed data;

an addressing portion for comparing said reconstructed data with a predetermined value and decoding the data; and a memory for storing the size of said variable-length-encoded word and the fixed-length code corresponding thereto which are output according to the output of said addressing portion.

2. A Huffman decoder as claimed in claim 1, wherein said addressing portion comprises:

comparators for receiving the upper bits of the rotated data output from said data rotator and comparing an address set in comparators with the received upper bits; and binary decoders which are activated by the output of said comparators, for receiving and decoding the lower bits of said rotated data.

3. A Huffman decoder as claimed in claim 1, further comprising a table selector for selecting a specific Huffman table among a plurality of Huffman tables according to said table selection signal.

* * * * *